United States Patent
Narasimalu et al.

(10) Patent No.: US 8,104,660 B2
(45) Date of Patent: Jan. 31, 2012

(54) TRANSDUCER AND METHOD FOR MOUNTING THE SAME

(75) Inventors: Srikanth Narasimalu, Singapore (SG); Chee Tiong Lim, Singapore (SG); Sathish Kumar Balakrishnan, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 376 days.

(21) Appl. No.: 11/418,003

(22) Filed: May 3, 2006

(65) Prior Publication Data

US 2007/0257083 A1    Nov. 8, 2007

(51) Int. Cl.
*B23K 1/06* (2006.01)
*B23K 20/10* (2006.01)

(52) U.S. Cl. .................................. 228/1.1; 228/110.1

(58) Field of Classification Search .................. 228/1.1, 228/110.1, 4.5, 180.5
See application file for complete search history.

(56) References Cited

U.S. PATENT DOCUMENTS

| | | | | |
|---|---|---|---|---|
| 4,884,334 A | * | 12/1989 | Houser et al. | 29/739 |
| 5,431,324 A | * | 7/1995 | Kajiwara et al. | 228/102 |
| 5,595,328 A | * | 1/1997 | Safabakhsh et al. | 228/1.1 |
| 5,603,445 A | | 2/1997 | Hill et al. | 228/4.5 |
| 6,719,183 B2 | | 4/2004 | Kyomasu et al. | 228/1.1 |
| 6,740,058 B2 | * | 5/2004 | Lal et al. | 604/65 |

* cited by examiner

*Primary Examiner* — David Sample
*Assistant Examiner* — Megha Mehta
(74) *Attorney, Agent, or Firm* — Ostrolenk Faber LLP

(57) ABSTRACT

A transducer is provided that comprises a horn having a longitudinal axis, a bonding tool attached to the horn, and an ultrasonic generator attached to the horn and spaced from the bonding tool along the longitudinal axis of the horn. A flexure is attached to the horn between the bonding tool and the ultrasonic generator for supporting the horn whereby to increase its dynamic rigidity in directions transverse to the longitudinal axis.

17 Claims, 5 Drawing Sheets

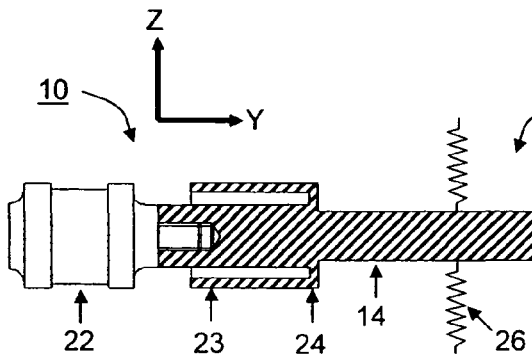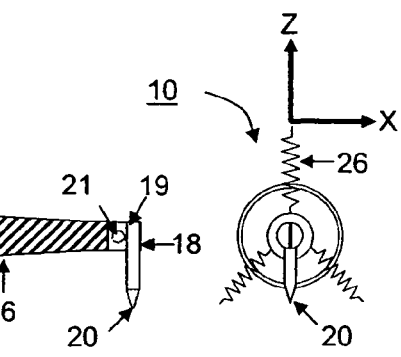
FIG. 3A     FIG. 3B
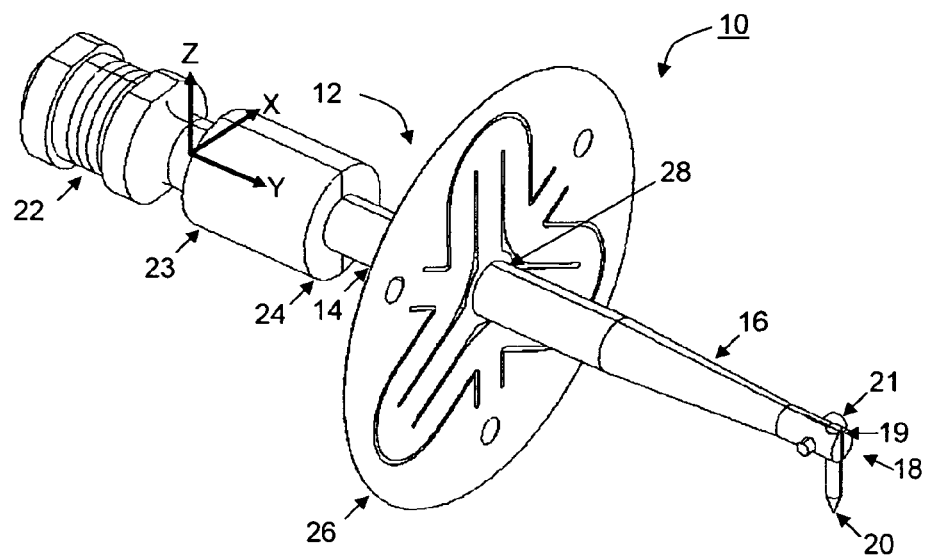
FIG. 4

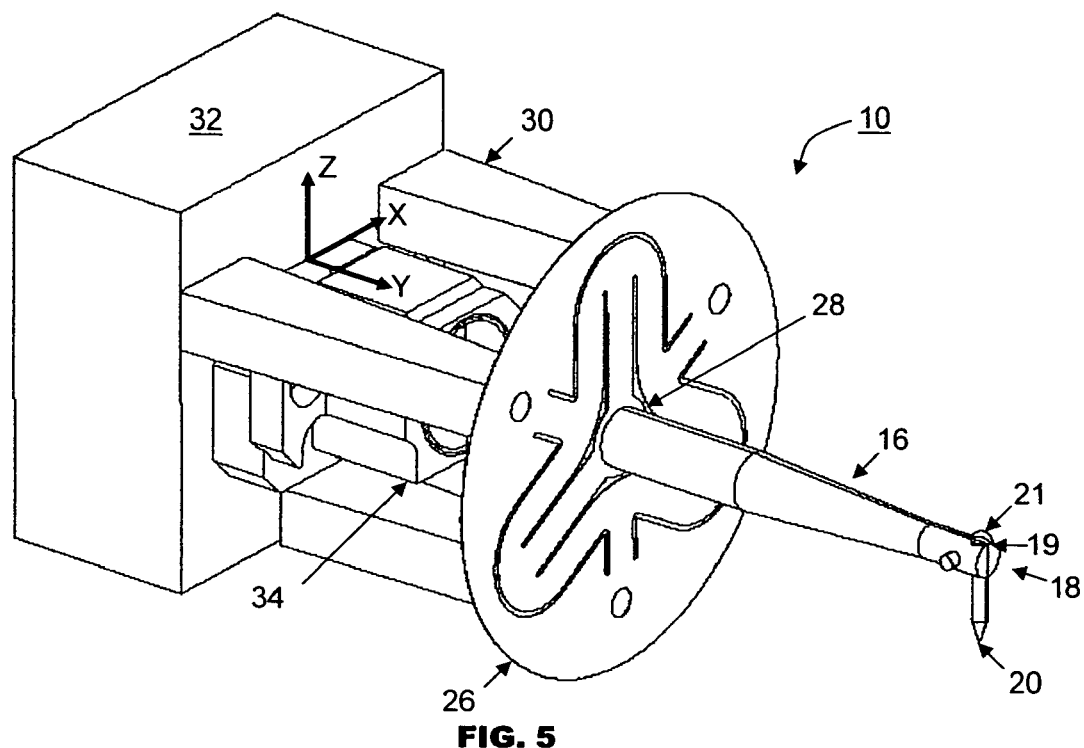
FIG. 5
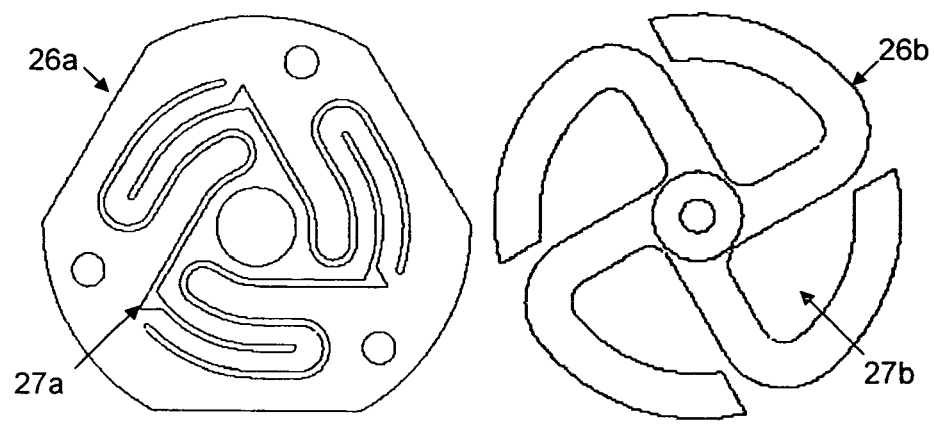
FIG. 6A  FIG. 6B

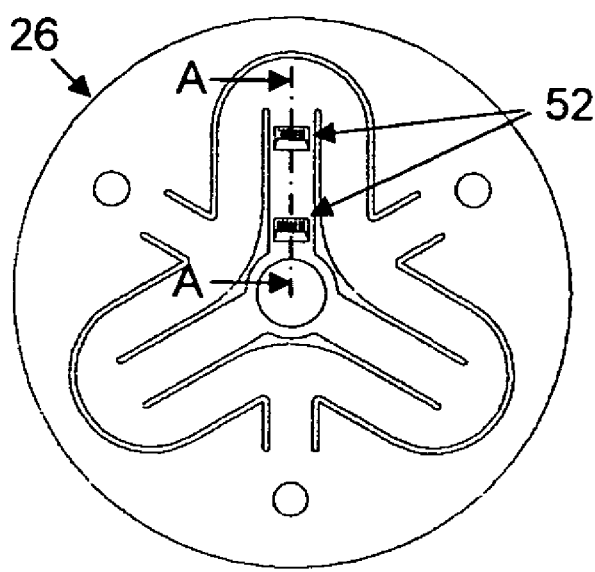 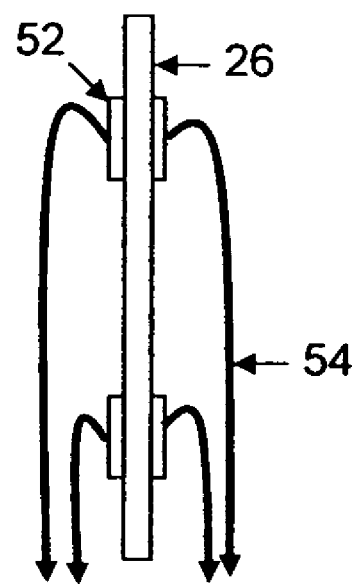
FIG. 9A      FIG. 9B

TRANSDUCER AND METHOD FOR MOUNTING THE SAME

FIELD OF THE INVENTION

The invention relates to a transducer tool, and in particular to mounting the transducer tool to a machine, such as a bonding machine.

BACKGROUND AND PRIOR ART

In the assembly of semiconductor devices, many electrical interconnections formed on the integrated circuits are made with thermosonic bonding. It is known in the art that the thermosonic bonding process used in wire bonding of electronic devices utilizes an ultrasonic transducer for providing ultrasonic vibrational energy to fine wires of electrically conductive bonding materials, such as aluminum, copper or gold wires, thereby bonding them onto the bond pads of a die or a substrate by mutual friction between the surfaces.

FIG. 1 is a sectional side view of a transducer 100 of the prior art. The transducer 100 comprises a horn 102 having a main body for transmission of ultrasonic energy including a solid cylindrical portion 104. An ultrasonic generator 112, which comprises a piezoelectric motor, is attached to one end of the horn 102 through a threaded hole formed at one end of the solid cylindrical portion 104. The ultrasonic generator 112 will provide the transducer 100 with ultrasonic bonding energy when it is energized during the bonding process.

The horn 102 further comprises a frusto-conical portion 106 that extends from the solid cylindrical portion 104 and converges towards a distal tip 108 at the end of the horn 102. A bonding tool, such as a capillary 110, is attached to a hole formed near to the tip 108, and the capillary 110 is arranged orthogonally to the longitudinal axis of the horn 102. The capillary 110 has a hole extending centrally through its body for receiving fine bonding wires used during wire bonding.

When ultrasonic energy is supplied, it will be transmitted from the ultrasonic generator 112 to the horn 102, through the capillary 110, and eventually to the tip of the capillary 110. The tip of the capillary 110 will thereby oscillate in accordance with a characteristic frequency and corresponding amplitude of vibration. Hence, the wire at the tip of the capillary 110 may be ultrasonically welded onto a bond pad on a die or a substrate when the wire is pressed against the bond pad by the capillary 110.

The ultrasonic energy generated by the ultrasonic generator 112 will excite the transducer 100 such that a varying amplitude of ultrasonic vibration along the longitudinal axis of the transducer 100 exhibits characteristics of a standing waveform. FIG. 2 is a graph showing the varying amplitudes of ultrasonic vibration 120, 130 along the transducer 100 of the prior art when ultrasonic energy is generated at frequencies of 97 kHz and 138 kHz respectively. In order to deliver a maximum amplitude of ultrasonic vibration for the bonding process, the tip of the capillary 110 is preferably disposed at anti-nodal positions 122, 132 of the standing waveforms. This is at the tip 108 of the horn 102 where the amplitude of ultrasonic vibration 120, 130 is maximum.

A holding portion 114 of the transducer 100 where the transducer 100 is clamped by a bond head is preferably disposed at nodal positions 124 of the standing waveforms where there is a minimum amplitude of ultrasonic vibration. At such locations, the ultrasonic vibration is ideally zero, so that the transmission of ultrasonic energy out of the horn 102 through the holding portion 114 is minimized, and hence ultrasonic energy losses through the transducer holder of the bond head supporting the transducer 100 are minimal.

However, the transducer 100 is in continual motion during the bonding operation when the bond head relocates the capillary 110 for performing bond placement at different bond pad locations. Therefore, the transducer 100 is subjected to low cycle fluctuating forces in transverse directions with respect to the longitudinal axis of the transducer 100. This will adversely affect its rigidity, and in particular its dynamic rigidity, and hence the bonding quality.

Various transducer mounting methods have been implemented in the prior art to minimize the loss of ultrasonic energy transmitted through the mounting attachment of the transducer 100. In a single nodal mount approach illustrated in U.S. Pat. No. 5,603,445 entitled "Ultrasonic Wire Bonder and Transducer Improvements", the transducer is designed to generate a standing wave comprising one wavelength and a mounting bracket is positioned at a nodal position which is at a distance of ¾ wavelength from an anti-nodal position of the transducer at which a capillary is disposed.

It should be understood that by having the holding portion 114 of the mounting bracket disposed at the nodal position 124 of the ultrasonic waveform, the connection between the holding portion 114 and the horn 102 should be as thin as possible so that the loss of ultrasonic energy through the mounting bracket is minimized. On the other hand, a very thin single nodal holding portion 114 on the transducer 100 of the prior art is generally at the cost of its dynamic rigidity.

Alternatively, a dual nodal mount approach illustrated in U.S. Pat. No. 6,719,183 entitled "Transducer and a Bonding Apparatus Using the Same" attempts to overcome some of the above-mentioned problems by providing at least two holding portions on the mounting bracket such that locations of the multiple holding portions correspond to the nodes of ultrasonic vibration of the transducer.

Although this approach of holding the transducer 100 at two positions may produce a more rigidly mounted transducer, one of the constraints in this dual nodal mount approach is that the transducer is only operable in a single ultrasonic frequency mode. Contrast this to FIG. 2, where the graph shows different variations in the amplitudes of ultrasonic vibration 120, 130 along the transducer 100 of the prior art when ultrasonic energy is generated at frequencies of 97 kHz and 138 kHz respectively. Due to the differences in the wavelengths for different operating frequencies, ultrasonic energy generated at an operating frequency of 97 kHz is such that the arrangement of the nodes 124 and the anti-nodes 122 on the standing waveform 120 may substantially differ from the arrangement of the nodes 124 and the anti-nodes 132 on the standing waveform 130 for ultrasonic energy generated at an operating frequency of 138 kHz. Therefore, if the holding portions 114 are rigidly fixed at two different nodal positions at a particular operating frequency, the nodal positions of a second operating frequency may not coincide with that of the aforesaid first operating frequency at the same location of the holding portions 114.

As such, a transducer which is clamped at nodal positions corresponding to the first operating frequency will be operating less effectively when driven with the second operating frequency as ultrasonic energy is lost through transmission to the bond head because the holding portions are no longer located at the nodal positions. Hence, by fixing the holding portions 114 at two different nodal positions at a particular operating frequency, the dual nodal mount approach constrains the transducer to be operable in only a single ultrasonic frequency. It would be desirable to permit different operating frequencies to be used with the transducer for different bonding requirements.

Therefore, it would be advantageous to avoid some of the aforesaid disadvantages of the prior art by having a transducer that is operable at two or more operating frequencies, and yet has high dynamic rigidity.

SUMMARY OF THE INVENTION

It is thus an object of the invention to seek to provide a support for a transducer that not only serves to improve dynamic rigidity, but may also allow the operation of the transducer at two or more operating frequencies.

Accordingly, the invention provides a transducer comprising: a horn having a longitudinal axis; a bonding tool attached to the horn; an ultrasonic generator attached to the horn and spaced from the bonding tool along the longitudinal axis of the horn; and a flexure attached to the horn between the bonding tool and the ultrasonic generator for supporting the horn whereby to increase its dynamic rigidity in directions transverse to the longitudinal axis.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of apparatus and methods for mounting a transducer in accordance with the invention will now be described with reference to the accompanying drawings, in which:

FIGS. 3A and 3B are a schematic side view and a schematic front view respectively of a transducer according to the preferred embodiment of the invention;

FIG. 4 is an isometric view of the transducer according to the preferred embodiment of the invention including a circular flexural spring;

FIG. 5 is an isometric view of the transducer according to FIG. 4 that has been mounted onto a bond head;

FIGS. 6A and 6B are plan views of different designs of flexural springs that are applicable for supporting a transducer according to the preferred embodiment of the invention;

FIG. 9A is a plan view of a flexural spring mounted with micro-strain sensors; and FIG. 9B is a sectional view of a portion of the flexural spring mounted with micro-strain sensors when looking along the line A-A of FIG. 9A.

DETAILED DESCRIPTION OF THE PREFERRED EMBODIMENT

Figure 1:
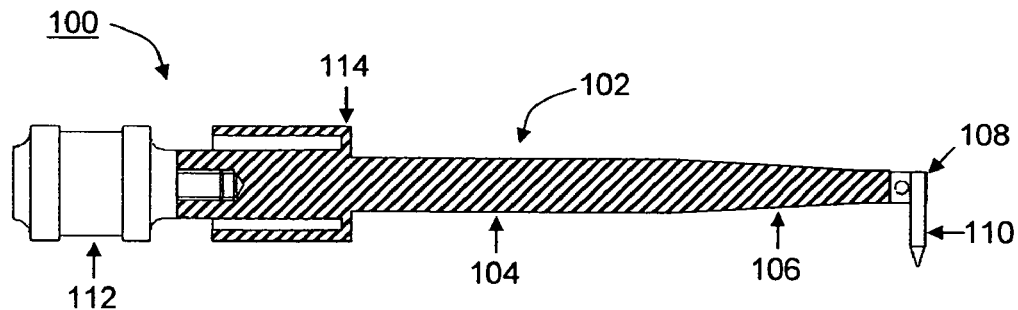
FIG. 1 is a sectional side view of a transducer of the prior art.
Figure 2:
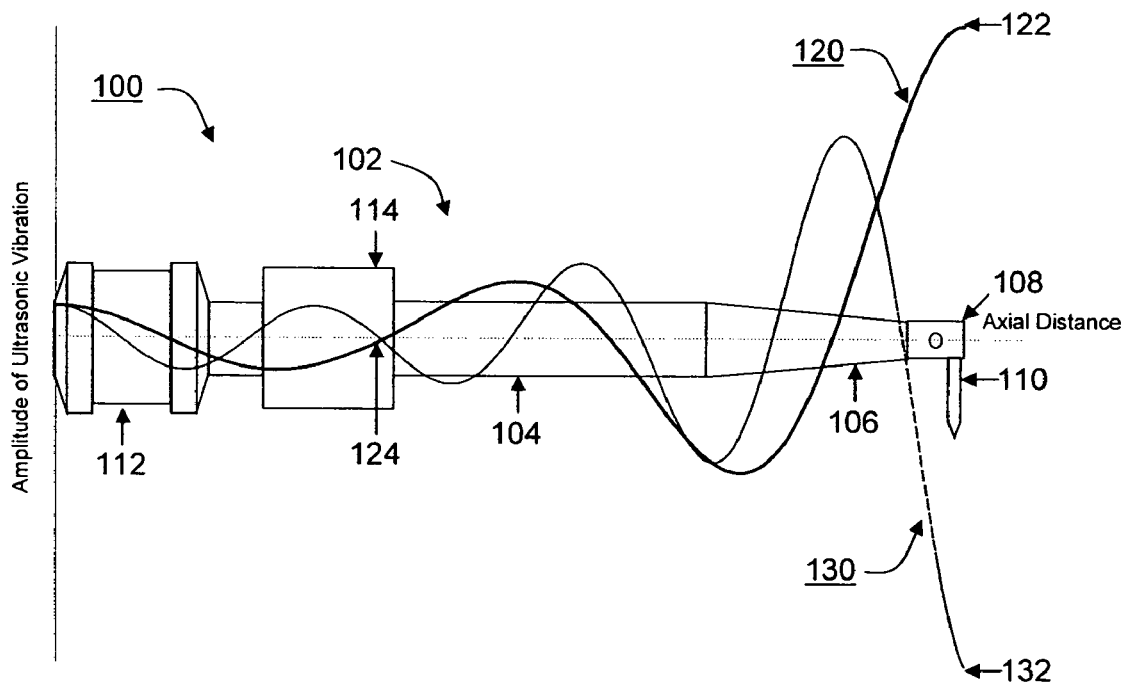
FIG. 2 is a graph showing the varying amplitudes of ultrasonic vibration along the length of the transducer of the prior art when ultrasonic vibrational energy is generated at frequencies of 97 kHz and 138 kHz respectively.

Referring to the drawings in which like parts are referred to by like numerals, FIGS. 3A and 3B are a schematic side view and a schematic front view respectively of a transducer 10 according to the preferred embodiment of the invention.

The transducer 10 comprises a horn 12 which has a longitudinal axis and a cylindrical main body for transmission of ultrasonic energy. The horn 12 includes a solid cylindrical body 14, which substantially contributes to the stiffness of the horn 12.

An ultrasonic generator 22 comprising a piezoelectric motor for generating ultrasonic energy is screwed onto one end of the horn 12 through a threaded hole formed at an end of the solid cylindrical body 14. The ultrasonic generator 22 will provide the transducer 10 with ultrasonic bonding energy when it is energized. The ultrasonic energy generated will excite the transducer 10 such that a varying amplitude of ultrasonic vibration along the longitudinal axis (Y-axis) of the transducer 10 exhibits characteristics of a standing waveform.

The horn 12 further comprises a frusto-conical portion 16 which extends from the solid cylindrical body 14 and converges towards a distal tip 18 at the end of the horn 12. The convergence is such as to amplify the amplitude of vibration at the tip 18 of the horn 12 to a desired magnitude when ultrasonic energy is applied to the horn 12 by the ultrasonic generator 22.

There is a slitted hole 19 near the tip 18 of the horn 12 that is oriented orthogonally to the longitudinal axis (Y-axis) of the horn 12. The slitted hole 19 is preferably located at an anti-nodal position of an ultrasonic standing waveform generated by the ultrasonic generator 22 along the longitudinal axis of the horn 12 so that a maximum amplitude of ultrasonic vibration may be delivered at the position of the slitted hole 19.

A bonding tool, in the form of a capillary 20, is attached to the horn 12 at the position of the slitted hole 19. A screw 21 is fitted across a slit opening extending from the slitted hole 19 for securing the capillary 20 when the screw 21 is tightened to close the slit opening. The screw 21 is made of soft material so that the ultrasonic energy that is generated from the ultrasonic generator 22 and transmitted to the tip of the capillary 20 is not absorbed by the material. The capillary 20 comprises a hole centrally extending through its body for receiving fine wires of conductive material, such as aluminum, copper or gold wire.

The horn 12 further comprises a holding flange 24 that is spaced from the ultrasonic generator 22. The holding flange 24 is connected to a clamping portion 23, typically in the form of a barrel, for mounting the transducer 10 onto a bond head (not shown). The clamping portion 23, the holding flange 24 and the horn 12 may be integrally formed from a single piece of material. The clamping portion 23 may also be in the form of flange mounts extending outwardly in directions perpendicular to the longitudinal axis of the horn 12. Such flange mounts would typically include a plurality of mounting holes for mounting the transducer 10 onto the bond head.

The holding flange 24 is preferably located at a nodal position of the ultrasonic standing waveform where there is a minimum amplitude of ultrasonic vibration. As the amplitude of ultrasonic vibration generated in the horn 12 is ideally zero at the nodal position, ultrasonic energy transmitted through the holding flange 24 and hence lost through the clamping portion 23 and the bond head is reduced.

The horn 12 further comprises a flexure, such as a flexural spring 26, attached to it between the ultrasonic generator 22 and the capillary 20 whereby to increase the dynamic rigidity of the transducer 10. FIG. 4 is an isometric view of a transducer 10 according to the preferred embodiment of the invention including a circular flexural spring 26. The flexural spring 26 is configured to have a relatively low axial stiffness in directions parallel to the longitudinal axis of the horn 12 (the Y-direction). Since the low axial stiffness allows the flexural spring 26 to flex more easily in the axial direction, the mounting point 28 of the flexural spring 26 on the horn 12 will therefore oscillate according to the ultrasonic vibration and not affect the transmission of ultrasonic energy along the Y-direction of the horn 12. Conversely, the flexural spring 26 is configured to have a relatively high radial stiffness in directions transverse to the longitudinal axis of the horn 12 (in the X-direction and Z-direction) for supporting the horn 12 in the transverse directions.

In order to mount the flexural spring 26, the horn 12 is preferably made from two separate components that are made to sandwich the flexural spring 26 tightly when assembled. Other attachment methods may also be used.

Accordingly, the flexural spring 26 acts as an additional radial support for the horn 12, but will not constrain the transducer 10 in the longitudinal direction to be only operable in a single ultrasonic frequency since the mounting point 28 of the flexural spring 26 is not limited to nodal locations of a particular frequency on the horn 12. Nevertheless, in one preferred embodiment of the invention, the flexural spring 26 is located at a nodal position of a standing waveform representing the ultrasonic vibration generated along the longitudinal axis of the horn 12. The portions of the horn 12 adjacent to the mounting point 28 may be allowed to oscillate notwithstanding the additional support. The transducer 10 supported by the flexural spring 26 is, therefore, able to operate in two or more ultrasonic frequency modes.

The holding flange 24 proximate to the ultrasonic generator 22 may also be made as thin as possible, although not less than 1 mm in order to meet requirements for rigidity. Being thin, the transmission of the ultrasonic energy transmitted through the holding flange 24, and hence lost through the clamping portion 23 and the bond head is further minimized.

A high radial stiffness in the flexural spring 26 substantially constrains the horn 12 and thereby reduces its transverse oscillation caused by any low cycle fluctuating forces during movement of the horn 12. Thus, the transverse displacement of the tip of the capillary 20 with respect to the longitudinal axis of the transducer 10 caused by motion of the horn 12 during bonding operations may be minimized, and hence the bonding quality may be improved.

FIG. 5 is an isometric view of the transducer 10 according to FIG. 4 that has been mounted onto a bond head 32. The transducer 10 is mounted onto a transducer holder 34 such that the transducer holder 34 clamps the clamping portion 23 of the transducer 10 along a plurality of circumferentially arranged contact points on the barrel. The transducer holder 34 is in turn attached to the bond head 32. Hence, the transducer 10 is driven by the bond head 32 to move during the bonding operation.

Preferably, a plurality of flexure supports 30 extend from the bond head 32 parallel to the longitudinal axis of the horn 12 for mounting the flexural spring 26 onto the bond head 32. Since the flexural spring 26 is positionable at any location along the Y-direction of the horn 12, the flexure supports 30 may extend further towards the tip 18 of the horn 12 if the mounting point 28 is moved closer to the tip 18 for maximizing its support function and increasing the dynamic rigidity of the transducer 10.

The transducer 10 may further comprise one or more additional flexural springs 26 disposed along the longitudinal axis of the horn at different positions between the ultrasonic generator 22 and the capillary 20 for further enhancing the dynamic rigidity of the transducer 10 in directions transverse to the longitudinal axis of the horn 12. The multiple flexural springs 26 may be mounted to different sections of the horn 12 as well as to corresponding sections of the elongated flexure supports 30, such that they are all oriented parallel to the X-Z plane.

During the bonding operation, the ultrasonic generator 22 supplies ultrasonic energy, which will be transmitted from the ultrasonic generator 22 to the horn 12, through the capillary 20, and eventually to the tip of the capillary 20. The tip of the capillary 20 will thereby oscillate in accordance with a characteristic frequency and corresponding amplitude of vibration. Hence, wire located at the tip of the capillary 20 may be ultrasonically welded onto a bond pad on a die or a substrate when the wire is pressed against the bond pad by the capillary 20.

FIGS. 6A and 6B are plan views of different designs of flexural springs 26a, 26b that are applicable for supporting a transducer 10 according to the preferred embodiment of the invention. The flexural springs 26a, 26b, which comprise a low axial stiffness and a high radial stiffness, are configured such that they are flexible in the axial direction, and they are also able to adequately support and improve the dynamic rigidity of the transducer 10 in the radial direction. These help to provide less hindrance to ultrasonic motion, especially under dual frequency modes of operation, and a higher radial resistance to bond tip oscillation during low frequency vibration caused by motion of the horn 12 attached to the bond head 32.

Each flexural spring 26a, 26b may be formed of a cutout profile from a sheet of flexible material. FIGS. 6A and 6B show two cutout shapes of the flexural springs 26 that are applicable to the transducer 10. FIG. 6A is a flexural spring 26a comprising a plurality of slots 27a arranged on the sheet of flexural material. The thin strips of flexible material that surround the slots 27a allow the flexural spring 26a to flex in the axial direction. On the other hand, the flexural spring 26b shown in FIG. 6B comprises a plurality of larger cutouts 27b removed from the material of the flexural spring 26b such that the thin strips of flexible material that remain from the cutout are radially projecting from the centre of the flexural spring 26b. The flexural springs 26a, 26b should be designed such that they have profiles that offer a low axial stiffness and a high radial stiffness. Therefore, the flexural springs 26 are also preferably constructed thin so that they have a low axial stiffness and high radial stiffness. The thickness of the flexural spring 26 is preferably between 0.05 mm to 0.15 mm.

If an axial load is applied to the flexural spring 26, the flexural spring 26 is generally stressed non-uniformly and rapidly. This generates local temperature differences, in the form of a temperature gradient, that depends on the local stress levels and properties of the flexural spring 26. The temperature gradient results in heat flow and causes energy dissipation from the flexural spring 26. The energy dissipation depends purely on the thermo-mechanical properties and thickness of the flexural spring 26. Thus, it is preferable to choose a thickness of the flexural spring 26 such that the loss coefficient ($\eta$) is small at the operating frequency ($\omega$) of the application so that the dampening energy ($0.5\eta\omega^2x^2$), where x is the ultrasonic amplitude of vibration, is minimized. To get a small $\eta$, one should take into account density ($\rho$), conductivity (K), thermal expansion (a), elastic modulus (E) of the material and specific heat (Cp). The flexural spring 26 is therefore preferably constructed such that the elasto thermo-dynamic dampening is minimal so that the energy dissipated is also minimized.

The energy consumed by the flexural spring 26 during the axial vibration is computable and is approximately equal to 0.5 kx², where k is the axial stiffness and x is the ultrasonic amplitude. For example, at an ultrasonic amplitude of approximately 1 μm and axial stiffness is in the order of 0.5 N/mm, there is minimal energy dissipation. The axial stiffness of the flexural spring 26 is preferred to be between 10 and 500 N/m and the radial stiffness is preferably between 500 and 3000 kN/m.

In an experimental setup, the flexural spring 26 of the transducer 10 of the preferred embodiment of the invention was positioned at approximately 18 mm from the holding flange 24 towards the tip of the horn 12. The deflection of the tip 18 of the transducer 10 with respect to the longitudinal axis of the transducer 10 was measured and compared with that of a prior art transducer 100 when both were undergoing linear motion with an acceleration of approximately 147 m/s². Experimental data showed that when the transducer 10 according to the preferred embodiment of the invention was accelerated at approximately 147 m/s², the tip 18 of the transducer 10 according to the invention was deflected by approximately 2.7 μm with respect to its longitudinal axis. On the other hand, when the prior art transducer 100 was accelerated at approximately 147 m/s², the tip 108 of the transducer 100 was deflected by approximately 3.9 μm with respect to its longitudinal axis. Thus, the transducer 10 according to the preferred embodiment of the invention appeared to have a lower deflection amplitude as compared to the prior art transducer 100, and therefore, appeared to have an improved dynamic rigidity.

In another experimental setup, the mechanical resonant frequency (2000 Hz) of the transducer was determined when a maximum amplitude of vibration was obtained at the tip of the transducer. In this experiment setup, a transducer 10 according to the preferred embodiment of the invention having a flexural spring 26 with a radial stiffness of 1500 N/mm was positioned at approximately 18 mm from the flange 24 of the transducer 10. Its resonant frequency was computed and compared with that of a prior art transducer 100. Experimental data showed that the transducer 10 according to the invention has a resonant frequency of approximately 1500 Hz. On the other hand, the prior art transducer 100 was found to have a resonant frequency of approximately 1250 Hz. It is desirable to have a higher resonant frequency so that the transducer is less susceptible to noise from an undesirable low frequency vibration source, such as that transmitted by motion of the bond head. Therefore, the transducer 10 according to the invention is advantageous as it has a higher resonant frequency.

Figure 7:
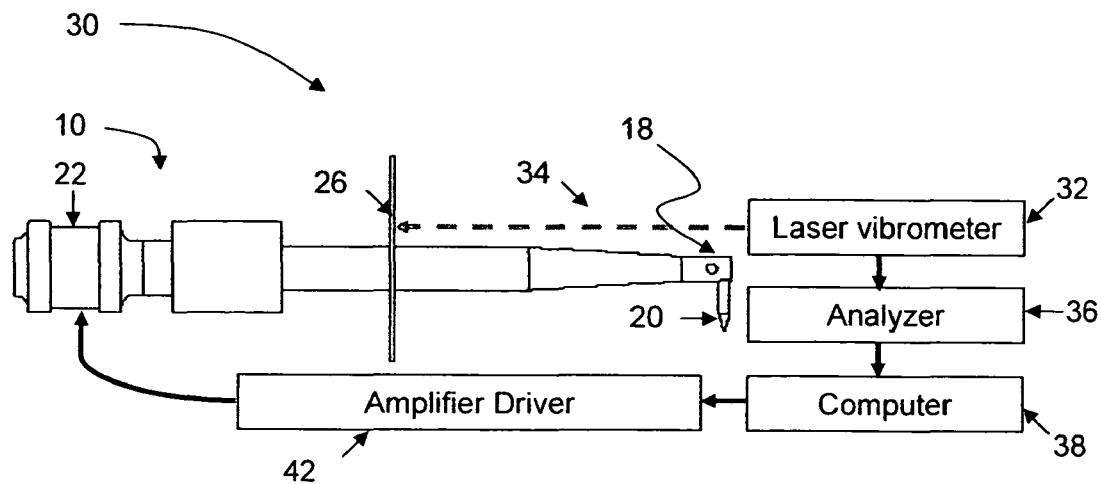
FIG. 7 is a schematic illustration of how an amplitude of oscillation of a transducer according to the invention may be measured and controlled in real time by utilizing a laser vibrometer.

Another advantage of the transducer of the preferred embodiment of the invention is that an oscillation measuring device can be incorporated for determining an amplitude of axial displacement of the flexural spring 26 in real time during operation of the transducer 10. With this information, power fed to the ultrasonic generator 22 is controllable to maintain a desired amplitude of vibration. FIG. 7 is a schematic illustration of how an amplitude of oscillation of a transducer 10 according to the invention may be measured and controlled in real time by utilizing an oscillation measuring device in the form of a noncontact laser vibrometer 32. When the flexural spring 26 is placed at a location other than the nodal location, the flexural spring 26 will oscillate together with the longitudinal vibration of the transducer 10. This will cause the flexural spring 26 to bend and shift out of the X-Z plane from its original position. The amplitude of vibration of the flexural spring 26 is measured using the laser vibrometer 32.

In FIG. 7, the laser vibrometer 32 is incorporated with an analyzer 36 and a computer 38 for measuring the variation of the amplitude of deflection of the flexural spring 26 at the position which the laser vibrometer 32 is aiming at. During thermosonic bonding, a gold ball at the capillary bonding tip of the transducer 10 is oscillated under pressure on the bond pad so as to bond the gold ball, and a constant amplitude of oscillation is required at the bonding tip. The amplitude of oscillation of the bonding tip in the longitudinal direction is relative to an amplitude of oscillation on the flexural spring 26 in the same direction. Accordingly, the amplitude of oscillation on the bonding tip may be controlled through a closed-loop control system, in which the laser vibrometer 32 measures in real time the amplitude of oscillation of the flexural spring 26 and feeds the captured information to an analyzer 36 and a computer 38 for processing. Thereafter, the computer 38 may adjust the power of the ultrasonic generator 22 of the transducer 10 by sending a bias signal to an amplifier driver 42. The closed-loop control system controls power fed to the ultrasonic generator 22 of the transducer 10 such that a constant amplitude of oscillation is obtained at the bonding tip of the transducer 10.

Figure 8:
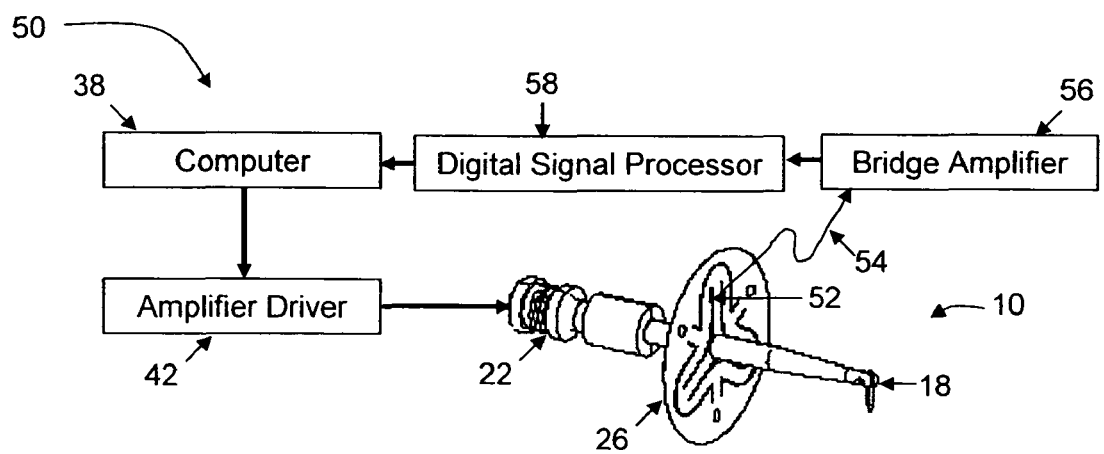
FIG. 8 is a schematic illustration of how an amplitude of oscillation of a transducer according to the invention may be measured and controlled in real time utilizing micro-strain sensors.

FIG. 8 is a schematic illustration 50 of how an amplitude of oscillation of a transducer 10 according to the invention may be measured and controlled in real time utilizing an oscillation measuring device in the form of micro-strain sensors. When the flexural spring 26 is placed at a location other than the nodal location, the flexural spring 26 will oscillate together with the longitudinal vibration of the transducer 10. The flexural spring 26 will bend and shift out of the X-Z plane from its original position. The induced strain on the flexural spring 26 may be measured using strain gauges, such as micro-strain sensors 52. The micro-strain sensors 52 may typically be of a piezo-resistive type or a piezo-capacitive type.

FIG. 9A is a plan view of a flexural spring 26 mounted with micro-strain sensors 52, and FIG. 9B is a sectional view of a portion of the flexural spring 26 mounted with micro-strain sensors 52 when looking along the line A-A of FIG. 9A. Referring to FIGS. 9A and 9B, the micro-strain sensors 52 are mounted to the front and back of the flexural spring 26 of the transducer 10 along a section thereof that is encountering deflection. The signal from the micro-strain sensor 52 is electronically amplified by a bridge amplifier 56, and fed to a digital signal processor 58. Thereafter, the processed signal is sent to a computer 38 where the computer 38 may adjust the power fed to the ultrasonic generator 22 of the transducer 10 by sending a bias signal to the amplifier driver 42. This closed-loop control system is thus able to control power fed to the ultrasonic generator 22 of the transducer 10 such that a constant amplitude of oscillation is obtained at the bonding tip of the transducer 10.

The preferred embodiment of the invention demonstrates several advantages over the prior art by incorporating a flexural spring 26 which has a low axial stiffness and a high radial stiffness to the transducer 10. The low axial stiffness enables the flexural spring 26 to be flexible in the axial direction, thereby avoiding any adverse effects of positioning the flexural spring 26 at positions other than nodal locations of the horn 12. Thus, the addition of a flexural spring 26 on the horn 12 will have a minimal hindrance on the propagation of ultrasonic energy to the tip of the capillary 20 for bonding processes. As a result, the transducer is not constrained to be only operable in a single ultrasonic frequency. The transducer 10 according to the preferred embodiment of the invention is therefore operable in two or more frequency modes of vibration.

Moreover, the transducer 10 according to the preferred embodiment of the invention has enhanced radial stiffness, such that its dynamic rigidity is substantially improved. This is demonstrated by reduced transverse oscillation at the tip 18 of the transducer 10 during wire-bonding operations. Hence, the transducer 10 according to the preferred embodiment of the invention may effectively improve bonding quality. At the same time, the addition of the flexural springs 26 does not affect the ultrasonic frequency characteristics of the transducer 10, such that the same ultrasonic driving frequency may be used.

Furthermore, a plurality of flexural springs 26 may be attached along the longitudinal axis of the horn 12 for further enhancing the transverse rigidity of the transducer. These may serve to further reduce the lateral and vertical vibration of the transducer during the bonding process, and may thereby further improve the bonding quality.

The invention described herein is susceptible to variations, modifications and/or addition other than those specifically described and it is to be understood that the invention includes all such variations, modifications and/or additions which fall within the spirit and scope of the above description.

The invention claimed is:

1. A transducer comprising:
a horn having a longitudinal axis;
a bonding tool attached to the horn;
an ultrasonic generator attached to the horn and spaced from the bonding tool along the longitudinal axis of the horn;
a mounting portion for mounting the transducer, the mounting portion being in direct contact with the horn and located between the bonding tool and the ultrasonic generator; and
a flexure attached to and in direct contact with a cylindrical portion of the horn, the flexure being attached to and in direct contact with the horn between the bonding tool and the mounting portion for supporting the horn,
wherein the flexure is formed from a sheet of material, and completely surrounds a circumference of the cylindrical portion of the horn,
the mounting portion does not contact the flexure, and
the mounting portion comprises a holding flange and a clamping portion.

2. The transducer as claimed in claim 1, wherein the flexure has a relatively low stiffness in directions parallel to the longitudinal axis and a relatively high stiffness in directions transverse to the longitudinal axis.

3. The transducer as claimed in claim 2, wherein the flexure is operative to reduce transverse oscillation caused by low cycle fluctuating forces during motion of the horn.

4. The transducer as claimed in claim 2, wherein the stiffness of the flexure in directions parallel to the longitudinal axis of the transducer is 10-500 N/m and the stiffness of the flexure in directions transverse to the longitudinal axis is 500-3000 kN/m.

5. The transducer as claimed in claim 1, wherein the ultrasonic generator is operative to generate ultrasonic vibration along the longitudinal axis of the horn in the form of a standing waveform, and the flexure is located at a nodal point of said waveform.

6. The transducer as claimed in claim 1, wherein the horn is comprised of separate components and the flexure is sandwiched between the separate components for attachment to the horn.

7. The transducer as claimed in claim 1, wherein the ultrasonic generator and horn are configured to be operable in at least two ultrasonic frequency modes for ultrasonic bonding by the bonding tool.

8. The transducer as claimed in claim 1, further comprising one or more additional flexures attached to the horn between the bonding tool and the ultrasonic generator.

9. The transducer as claimed in claim 1, wherein the flexure is formed from a cutout profile from a sheet of flexible material.

10. The transducer as claimed in claim 9, wherein the flexure comprises strips of flexible material formed from the sheet of flexible material.

11. The transducer as claimed in claim 10, wherein the strips of flexible material project radially from a centre of the flexure.

12. The transducer as claimed in claim 1, wherein the flexure has a thickness of between 0.05 mm and 0.15 mm.

13. The transducer as claimed in claim 1, further comprising a oscillation measuring device for determining an amplitude of displacement of the flexure in real time during operation of the transducer.

14. The transducer as claimed in claim 13, wherein the oscillation measuring device comprises a laser vibrometer that is operative to measure a displacement amplitude of the flexure.

15. The transducer as claimed in claim 13, wherein the oscillation measuring device comprises a strain gauge mounted on the flexure that is operative to measure an induced strain on the flexure during oscillation for determining the amplitude of displacement of the flexure.

16. The transducer as claimed in claim 13, further comprising a closed-loop control system for receiving feedback concerning the amplitude of displacement of the flexure and for controlling an amount of power fed to the ultrasonic generator.

17. A transducer comprising:
a horn having a longitudinal axis;
a bonding tool attached to the horn;
an ultrasonic generator attached to the horn and spaced from the bonding tool along the longitudinal axis of the horn;
a mounting portion for mounting the transducer, the mounting portion being in direct contact with the horn and located between the bonding tool and the ultrasonic generator; and
a flexure attached to and in direct contact with the horn between the bonding tool and the mounting portion for supporting the horn,
wherein the mounting portion does not contact the flexure, and,
the mounting portion comprises a holding flange and a clamping portion, the holding flange being directly connected to the clamping portion, the clamping portion extending in a longitudinal direction parallel to the longitudinal axis of the horn, the horn being cylindrical along the length of the clamping portion, the clamping portion being a cylindrical barrel completely surrounding the cylindrical portion of the horn along the length of the clamping portion.

* * * * *